United States Patent
Gerhardt et al.

(10) Patent No.: US 9,136,177 B2
(45) Date of Patent: Sep. 15, 2015

(54) METHODS OF FORMING TRANSISTOR DEVICES WITH HIGH-K INSULATION LAYERS AND THE RESULTING DEVICES

(75) Inventors: Martin Gerhardt, Dresden (DE); Stefan Flachowsky, Dresden (DE); Matthias Kessler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 499 days.

(21) Appl. No.: 13/561,315

(22) Filed: Jul. 30, 2012

(65) Prior Publication Data

US 2014/0027859 A1    Jan. 30, 2014

(51) Int. Cl.
*H01L 29/76*     (2006.01)
*H01L 29/94*     (2006.01)
*H01L 31/062*    (2012.01)
*H01L 31/113*    (2006.01)
*H01L 31/119*    (2006.01)
*H01L 21/3205*   (2006.01)
*H01L 21/4763*   (2006.01)
*H01L 21/8234*   (2006.01)
*H01L 21/8238*   (2006.01)
*H01L 21/28*     (2006.01)
*H01L 29/51*     (2006.01)
*H01L 29/66*     (2006.01)
*H01L 29/78*     (2006.01)

(52) U.S. Cl.
CPC .... *H01L 21/82345* (2013.01); *H01L 21/28202* (2013.01); *H01L 21/823462* (2013.01); *H01L 21/823842* (2013.01); *H01L 21/823857* (2013.01); *H01L 29/513* (2013.01); *H01L 29/518* (2013.01); *H01L 29/66545* (2013.01); *H01L 29/7833* (2013.01)

(58) Field of Classification Search
CPC ................ H01L 21/82345; H01L 21/823462; H01L 21/823892
USPC ........ 257/392, E21.19, E27.06; 438/591, 581
See application file for complete search history.

(56) References Cited

U.S. PATENT DOCUMENTS

| | | | |
|---|---|---|---|
| 2005/0202672 A1* | 9/2005 | Divakaruni et al. | 438/652 |
| 2010/0184260 A1* | 7/2010 | Luo et al. | 438/154 |
| 2012/0009772 A1* | 1/2012 | Mathew et al. | 438/589 |
| 2013/0187236 A1* | 7/2013 | Xie et al. | 257/369 |

* cited by examiner

Primary Examiner — David S Blum
(74) Attorney, Agent, or Firm — Amerson Law Firm, PLLC

(57) ABSTRACT

Method of forming transistor devices is disclosed that includes forming a first layer of high-k insulating material and a sacrificial protection layer above first and second active regions, removing the first layer of insulating material and the protection layer from above the second active region, removing the protection layer from above the first layer of insulating material positioned above the first active region, forming a second layer of high-k insulating material above the first layer of insulating material and the second active region, forming a layer of metal above the second layer of insulating material, and removing portions of the first and second layers of insulating material and the metal layer to form a first gate stack (comprised of the first and second layers of high-k material and the layer of metal) and a second gate stack (comprised of the second layer of high-k material and the layer of metal).

19 Claims, 7 Drawing Sheets

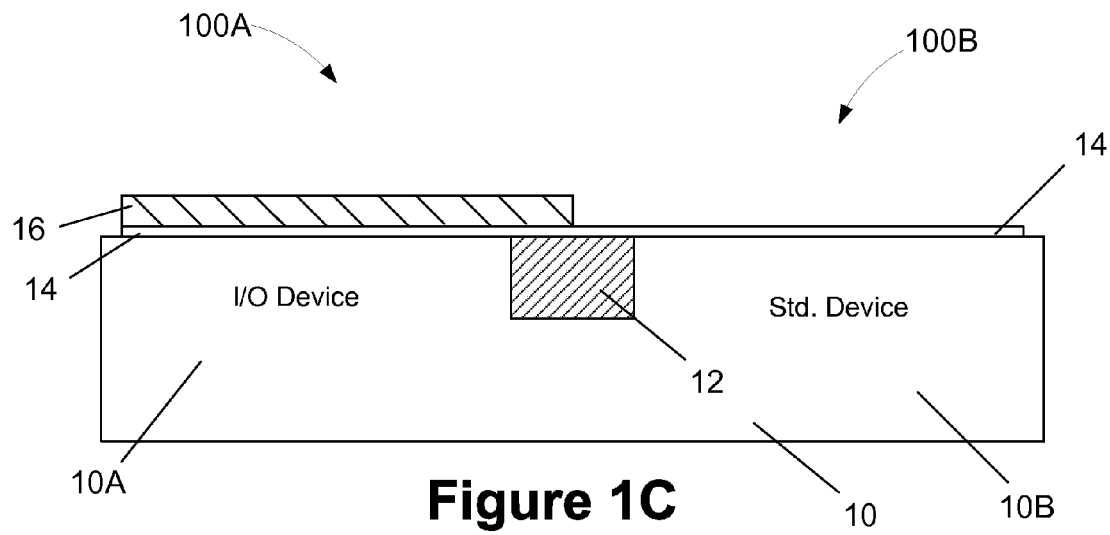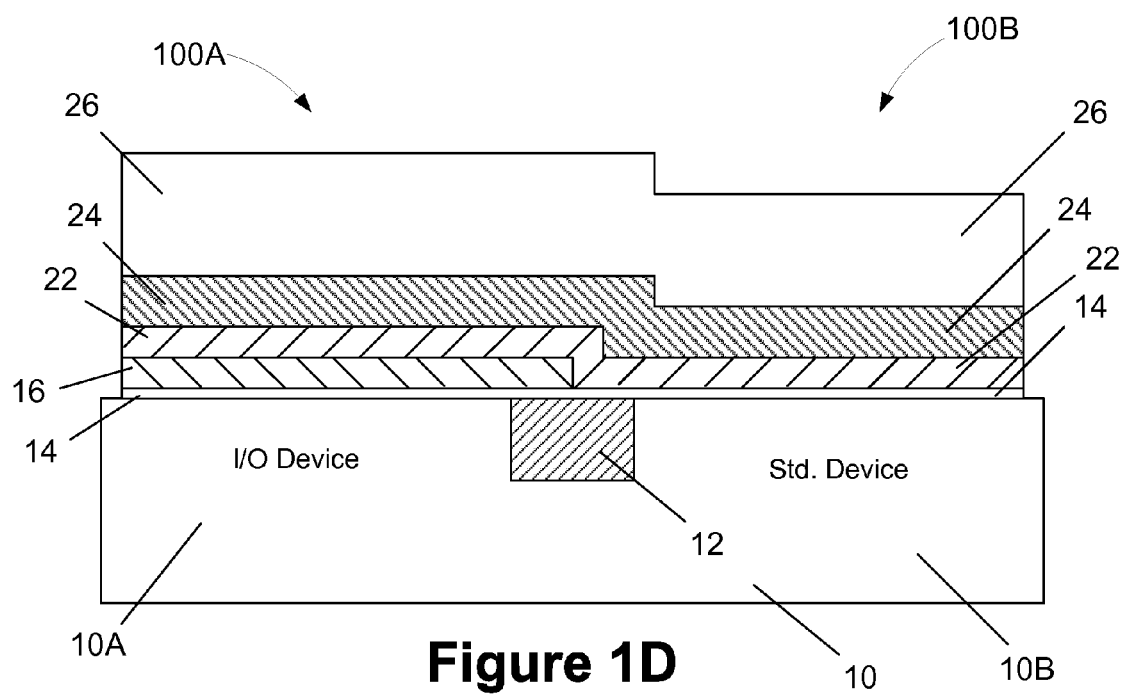

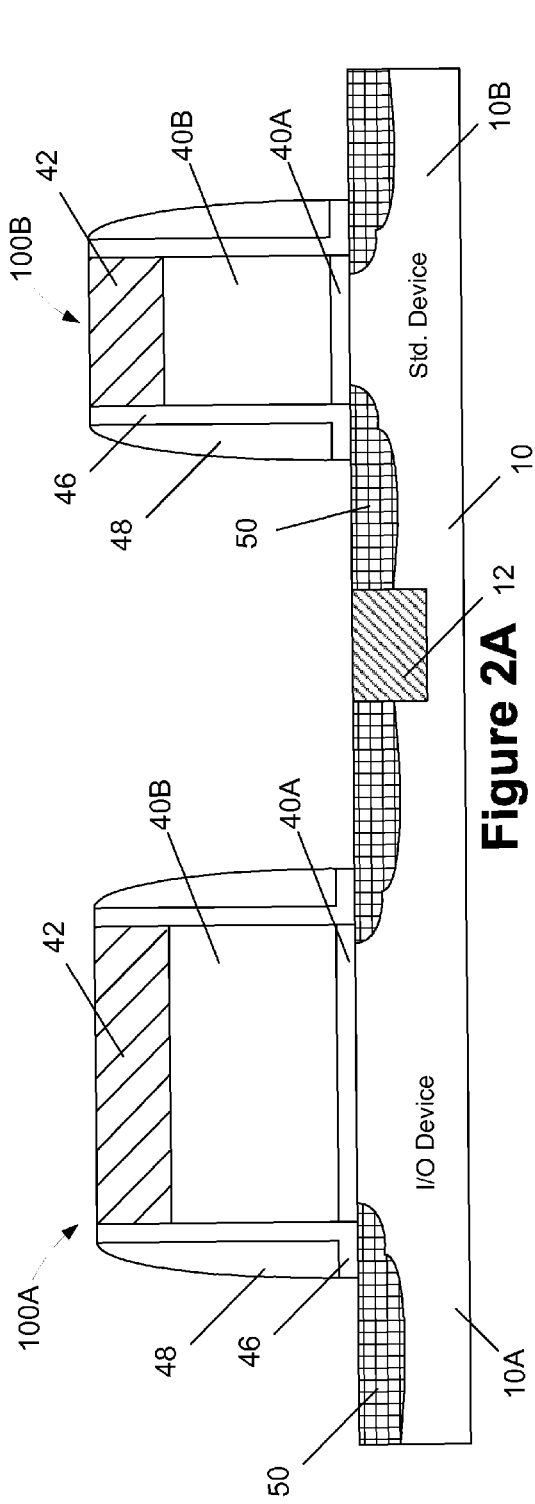
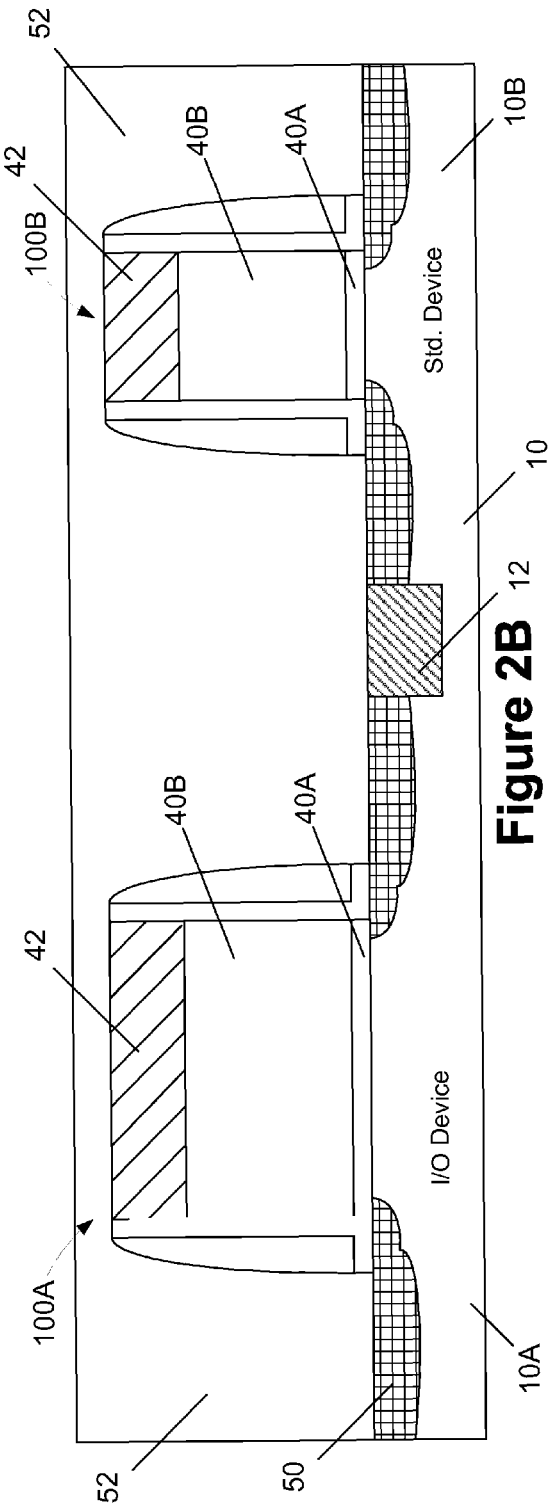
Figure 2A
Figure 2B

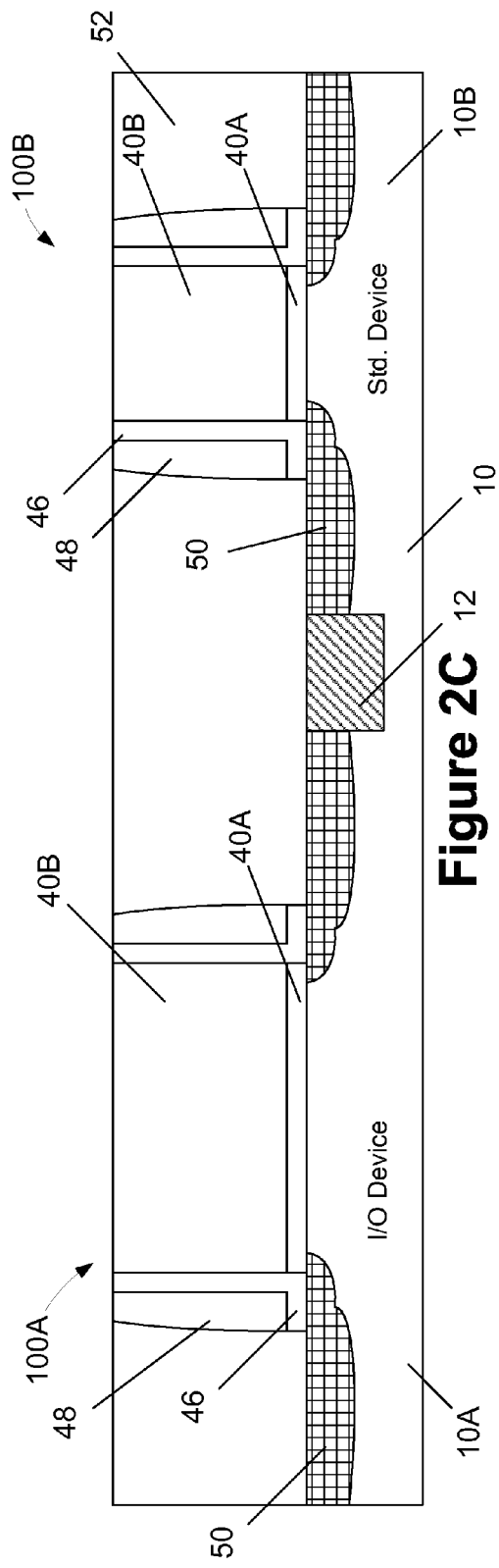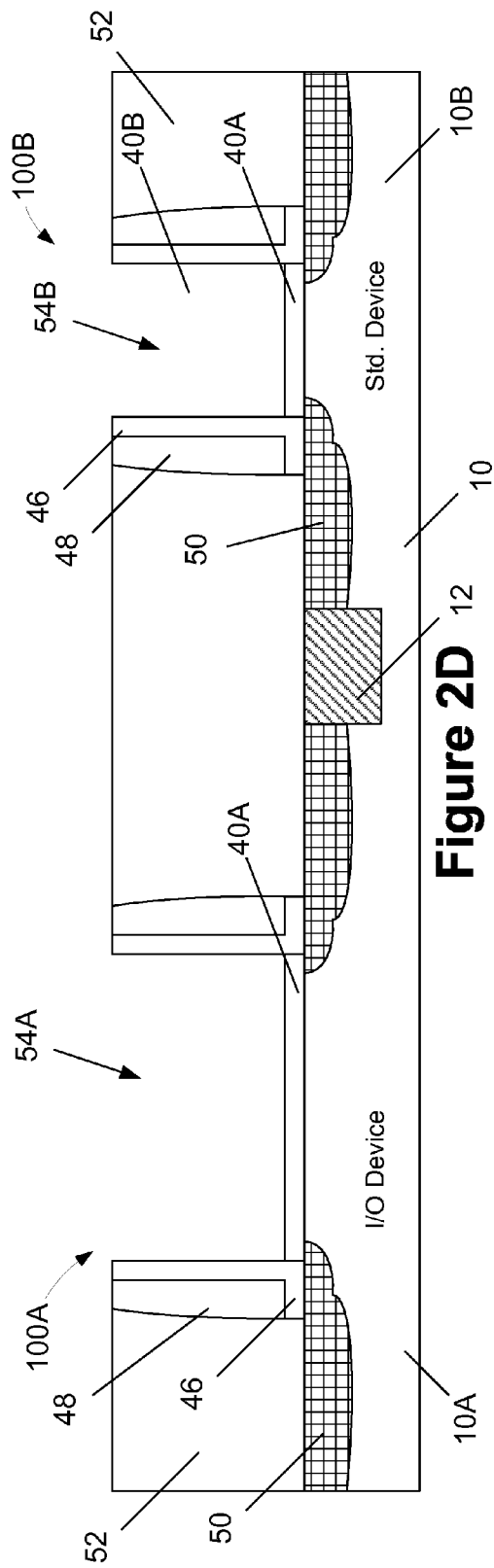

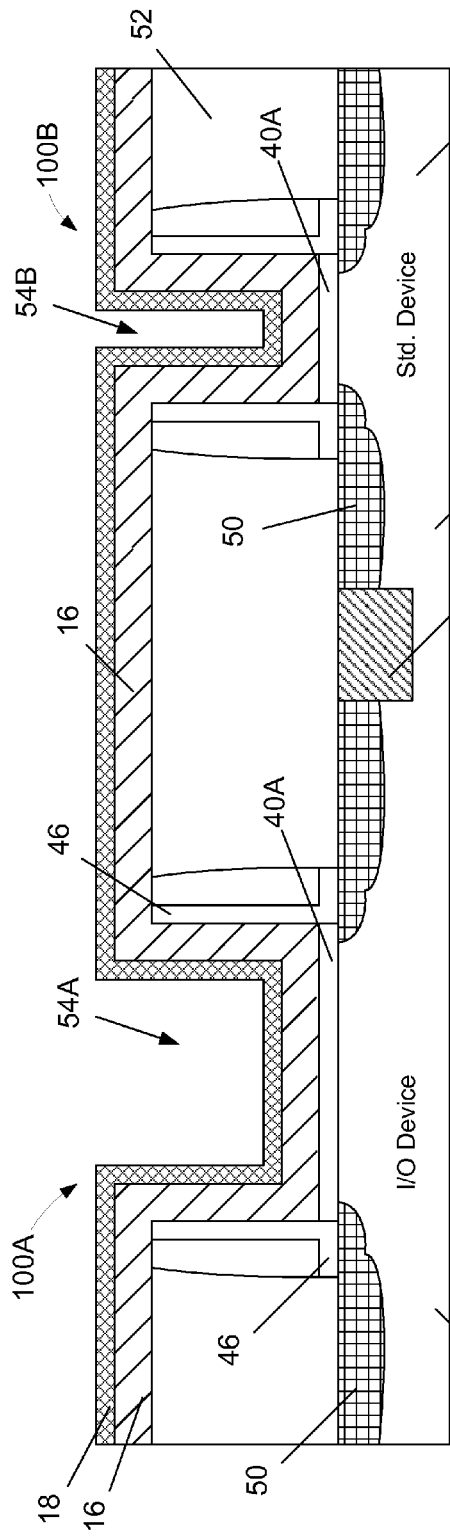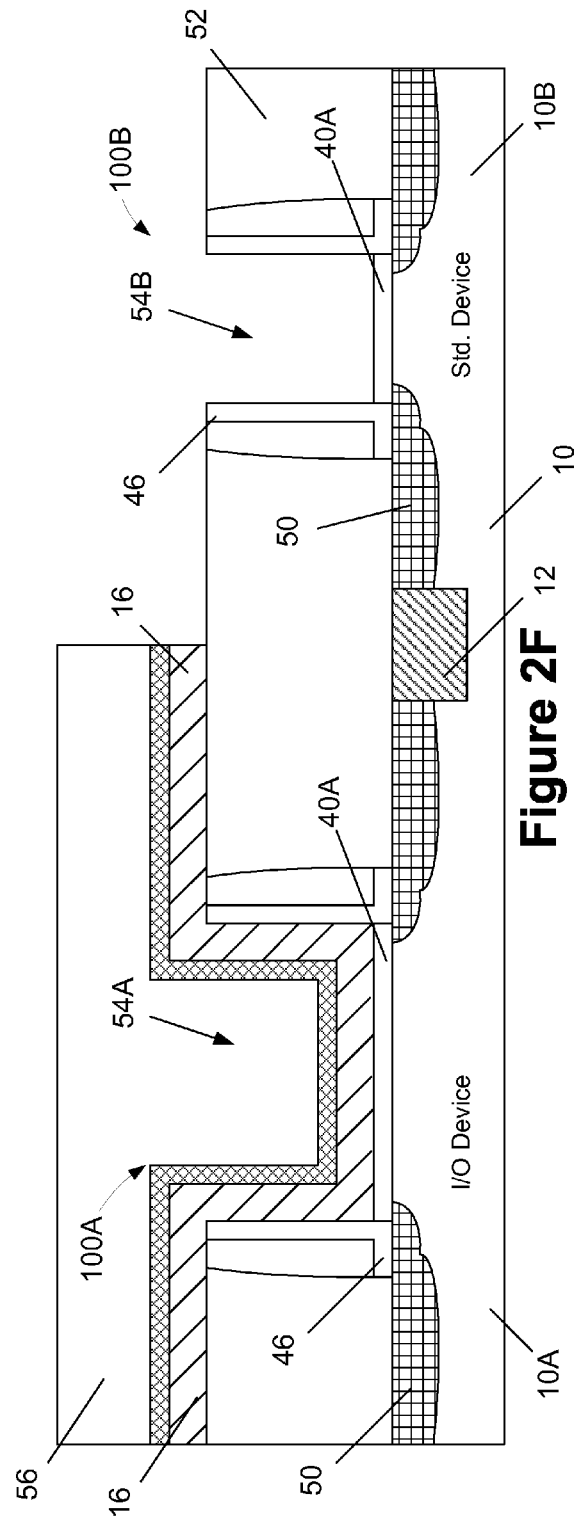

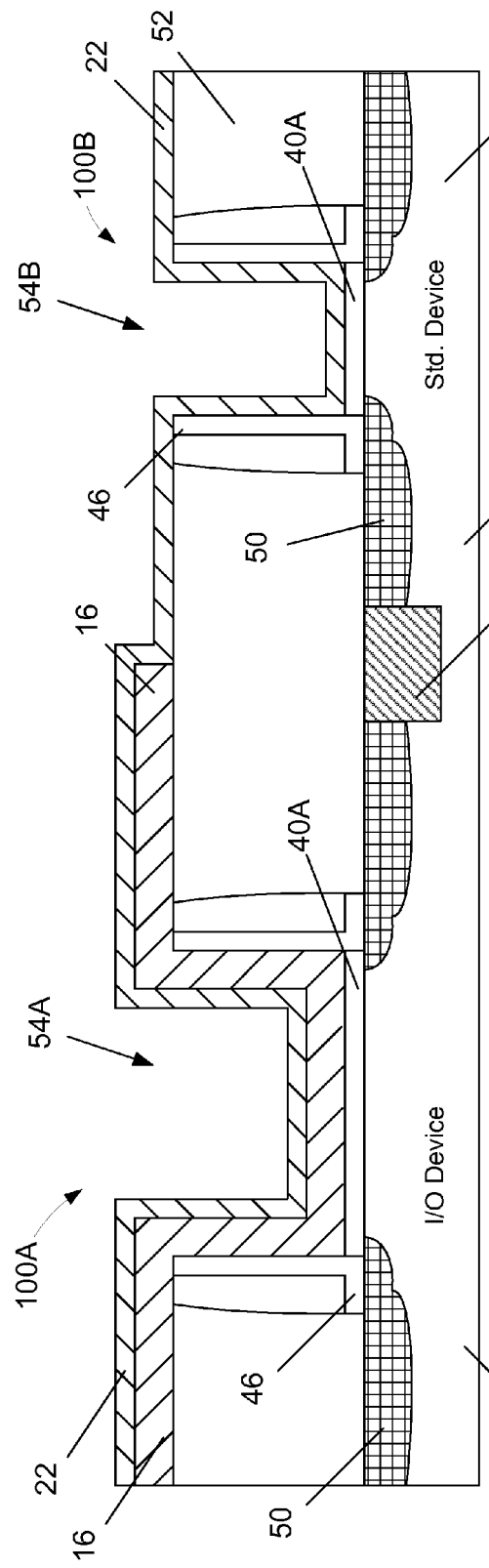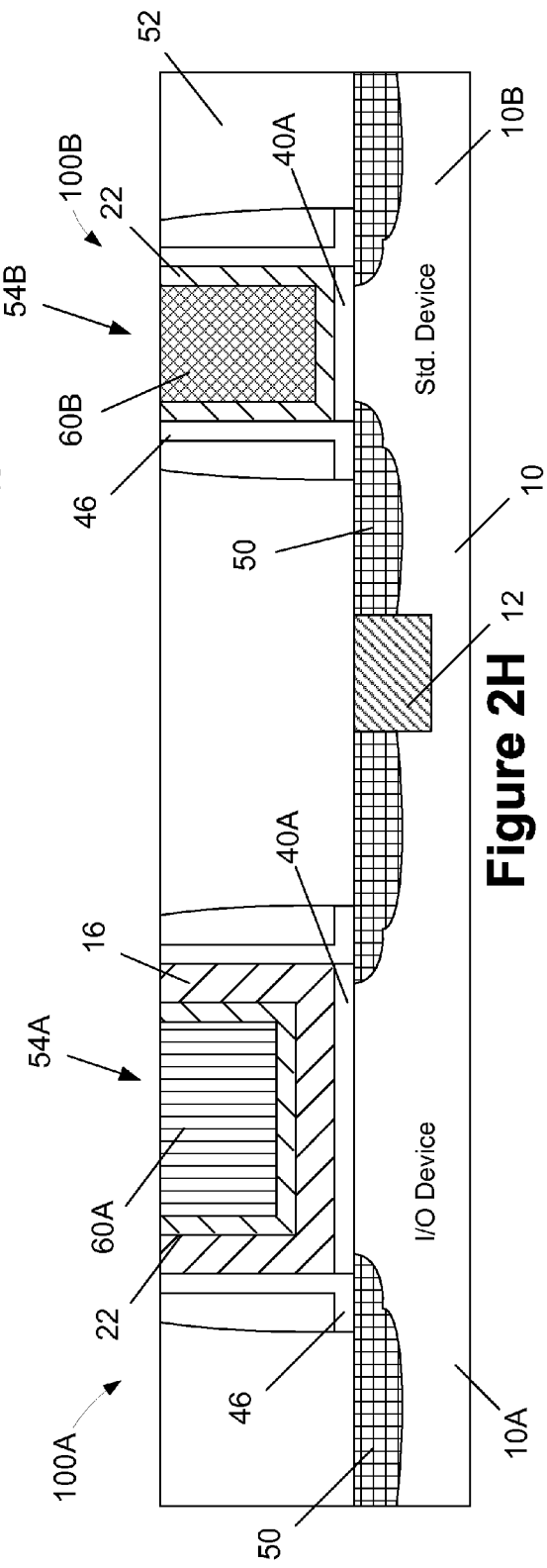

METHODS OF FORMING TRANSISTOR DEVICES WITH HIGH-K INSULATION LAYERS AND THE RESULTING DEVICES

BACKGROUND OF THE INVENTION

1. Field of the Invention

Generally, the present disclosure relates to the manufacture of sophisticated semiconductor devices, and, more specifically, to various methods of forming transistor devices that use high-k insulating materials and the resulting devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that is positioned between the source region and the drain region, and a gate electrode positioned above the channel region. Electrical contacts are made to the source and drain regions, and current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

For many early device technology generations, the gate electrode structures of most transistor elements have been comprised of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate stacks comprising a so-called high-k dielectric/metal gate (HK/MG) configuration have been shown to provide significantly enhanced operational characteristics over the heretofore more commonly used silicon dioxide/polysilicon (SiO/poly) configurations.

As noted above, many current day advanced integrated circuit products use transistor devices that have a high-k dielectric/metal gate (HK/MG) configuration to reduce device leakage and to increase device performance. However, the benefits achieved using such a high-k dielectric/metal gate (HK/MG) configuration for certain transistors have not been effectively realized. For example, in some integrated circuit products, some of the transistor devices are exposed to a larger operating voltage than other transistor devices on the same integrated circuit product. One specific example would be that of transistors that are employed in I/O circuitry, which may be exposed to an operating voltage of about 1.8 volts, whereas transistors that are part of the logic circuitry of such an integrated circuit product may only be exposed to a relatively lower operating voltage, e.g., about 1.0 volts. To accommodate these different voltage levels, prior art techniques involved integration of silicon dioxide layers with different thicknesses being appropriate to fulfill specific supply voltage dependent gate leakage and reliability requirements. For example, one such integration technique, generally referred to as a dual gate oxide process, uses the term "core" for areas with a relatively thin gate dielectric, and the term "IO" for areas with relatively thick gate dielectric layers. Such a dual gate oxide process typically involves forming (by deposition or thermal growth) a relatively thick (typically above 2 nm) type 1 oxide, masked oxide removal over the core area by wet etching and blanket growth, as well as several treatments of thin (typically below 1 nm) type 2 oxide followed by polysilicon deposition. It is relatively straightforward to produce a relatively homogeneous thick gate oxide for devices with a traditional gate structure (e.g., silicon dioxide gate insulation layer and polysilicon gate electrode) because the electrical and reliability specific properties of such layers are scaled with the total thickness. However, the situation is different for devices that employ a high-k gate insulation layer and one or more metal layers for the gate electrode (HK/MG devices). In HK/MG devices, after the type 1 oxide is formed as described above, a high-k layer of insulation material and one or more metal layers are formed above the type 1 oxide layer. In such HK/MG devices, the electrical properties are much more dependent on the inhomogeneous stack of materials—the silicon dioxide (with a relatively lower k value) and the high-k material layer formed there above. The capacitive behavior for the IO devices is dominated by the thicker silicon dioxide gate insulation layer for those devices. Thus, the high voltage devices do not achieve the full benefit of the high-k insulating material, such as significant reduced capacitive thickness at given or even reduced leakage currents.

The present disclosure is directed to various methods of forming I/O (input/output) and standard transistor devices that use high-k insulating materials that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming transistor devices that use high-k insulating materials and the resulting devices. In one example, a method disclosed herein includes forming a first layer of high-k insulating material above first and second active regions, forming a sacrificial protection layer above the first layer of high-k insulating material, removing the first layer of high-k insulating material and the sacrificial protection layer from above the second active region and thereafter removing the sacrificial protection layer from above the first layer of high-k insulating material that is positioned above the first active region. The method also includes forming a second layer of high-k insulating material above the first layer of high-k insulating material and above the second active region, forming at least one layer of metal above the second layer of high-k insulating material and removing portions of the first and second layers of high-k insulating material and the at least one metal layer to thereby form a first gate stack positioned above the first active region and to form a second gate stack positioned above the second active region. In this example, the first gate stack is comprised of at least the first and second layers of high-k insulating material and the at least one layer of metal and the second gate stack is comprised of at least the second layer of high-k insulating material and the at least one layer of metal.

One illustrative integrated circuit product disclosed herein includes a first transistor formed in and above a first active region of a semiconducting substrate and a second transistor formed in and above a second active region of the substrate. In this example, the first transistor has a gate stack comprised of a first layer of high-k insulating material positioned above the first active region, a second layer of high-k insulating material positioned on the first layer of high-k insulating material and at least one layer of metal positioned above the second layer of high-k insulating material. The second transistor has a gate stack comprised of the second layer of high-k insulating material that is positioned above the second active region, and the at least one layer of metal positioned above the second layer of high-k insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict an illustrative example wherein the methods disclosed herein may be employed when the various transistor devices are formed using so-called "gate-first" techniques; and FIGS. 2A-2H depict an illustrative example wherein the methods disclosed herein may be employed when the various transistor devices are formed using so-called "replacement gate" (RMG) or "gate-last" techniques.

Figure 1A:
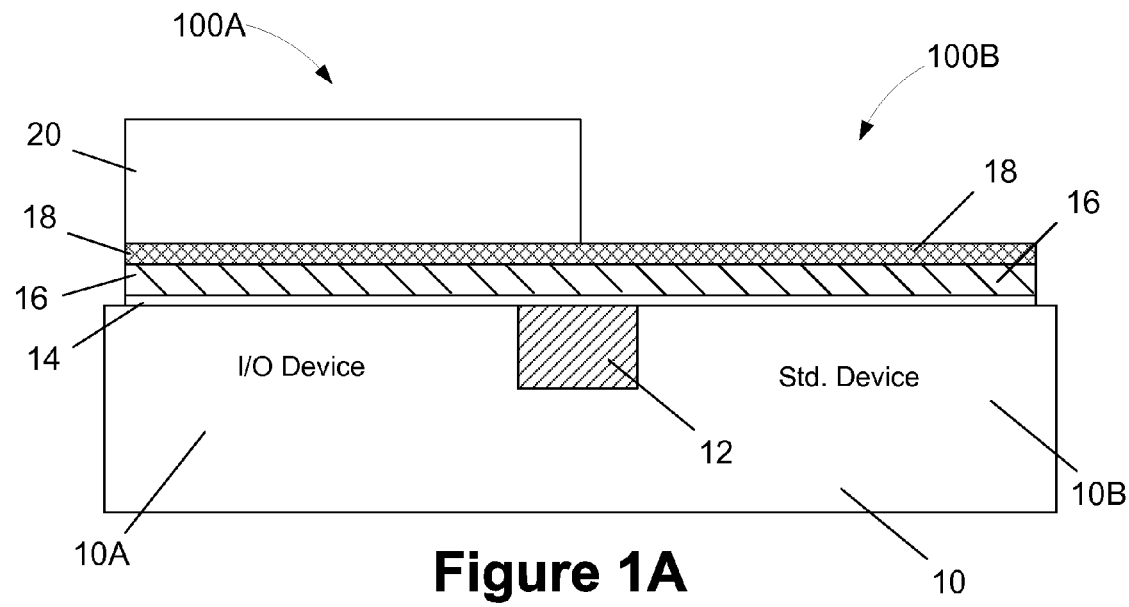

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming transistor devices that use high-k insulating materials and the resulting devices, such as, for example, I/O (input/output) transistor devices that are to be employed in I/O circuitry, as well as standard transistor devices, such as transistors that are employed in various logic circuitry of an integrated circuit product. As will be readily apparent to those skilled in the art upon a complete reading of the present application, the methods and structures disclosed herein may be applicable to a variety of devices, e.g., NFET, PFET, CMOS, etc., and they are readily applicable to a variety of integrated circuit products, including, but not limited to, ASICs, logic devices and circuits, memory devices and systems, etc. With reference to the attached drawings, various illustrative embodiments of the methods and devices disclosed herein will now be described in more detail.

FIGS. 1A-1F depict an illustrative example wherein the methods disclosed herein may be employed when the various transistor devices are formed using so-called "gate-first" techniques. FIG. 1A is a simplified view of a device at an early stage of manufacturing. The device is formed above a semiconducting substrate 10 and it is generally comprised of a first transistor device 100A and a second transistor device 100B. In one illustrative embodiment, the first transistor device 100A may be an I/O transistor device, while the second transistor device 100B may be a standard transistor device. The first device 100A will be formed in and above a first active region 10A, while the second transistor device 100B will be formed in and above a second active region 10B. An illustrative isolation structure 12, e.g., a shallow trench isolation structure, is formed in the substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In general, the gate lengths of the first transistor device 100A and the second transistor device 100B may vary depending upon the particular application. The first transistor device 100A may typically have a relatively large gate length, e.g., 150+ nm, and such devices 100A may be employed in applications like high-power applications, Input/Output circuits, etc., with a relatively high operating voltage, e.g., a voltage of about 1.8 volts in current generation devices. In contrast, the second transistor device 100B may have a gate length on the order of 40 nm or less, and it may be employed in logic circuit applications requiring high switching speed, e.g., microprocessors, memory devices, etc. Moreover, it should be understood that a typical integrated circuit product may have hundreds or thousands of such first transistor devices 100A and such second transistor devices 100B. Additionally, although the first transistor device 100A and the second transistor device 100B are depicted as being formed adjacent one another in the attached drawings, in practice, the various first transistor devices 100A and second transistor devices 100B are typically spread out across the substrate 10.

At the point of fabrication depicted in FIG. 1A, several layers of material have been formed above the substrate 10. In the depicted example, a gate insulation layer 14, a first layer of high-k (k value of 10 or greater) insulating material 16, a sacrificial protection layer 18 and patterned etch mask 20 have been formed using a variety of known techniques. In one illustrative embodiment, the gate insulation layer 14 may be comprised of silicon dioxide, silicon oxynitride (with 10-20% nitrogen content), etc., and it may have a thickness of about 1 nm or less. In some embodiments, the gate insulation layer 14 may take the form of a native oxide layer or an interfacial layer of silicon dioxide. The first high-k gate insulation layer 16 may be comprised of a variety of high-k materials (k value greater than 10), such as hafnium oxide, hafnium silicate, lanthanum oxide, zirconium oxide, etc. The thickness of the first layer of high-k insulating material 16 may vary depending upon the particular application, e.g., it may have a thickness of about 2-3 nm. The sacrificial protection layer 18 may be comprised of a metal, e.g., titanium nitride, etc., or it may be an insulating material, such as silicon dioxide, etc. Since the sacrificial protection layer 18 will eventually be removed, virtually any material may be employed as the sacrificial protection layer 18. The thickness of the sacrificial protection layer 18 may also vary depending upon the particular application, e.g., it may have a thickness of about 3-5 nm. The gate insulation layer 14, the first layer of high-k insulating material 16 and the sacrificial material layer 18 may be formed by performing a variety of known processes, e.g., a thermal growth process, a chemical vapor deposition (CVD) process, an atomic layer deposition (ALD) process, or plasma-enhanced versions of such processes. The patterned etch mask 20 may be a patterned layer of photoresist material that may be formed using well-known photolithography and etching tools. The patterned etch mask 20 covers the first devices 100A in the first active region 10A and leaves the second device 100B in the second active region 10B exposed for further processing. One reason that the sacrificial protection layer 18 is provided is because, if the photoresist etch mask 20 is formed directly on the first layer of high-k insulating material 16, complete removal of the photoresist material from the high-k material would be difficult and any residual photoresist material may adversely affect subsequent fabrication processes.

Figure 1B:
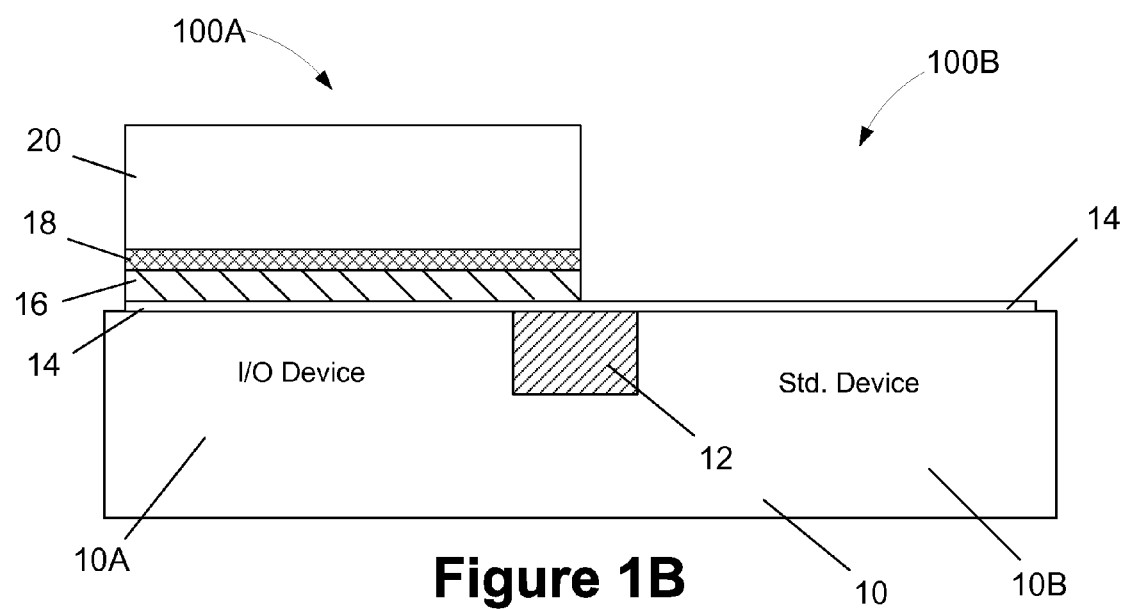

Next, as shown in FIG. 1B, one or more dry anisotropic etching processes are performed through the patterned etch mask 20 to remove at least the portions of the sacrificial protection layer 18 and the first layer of high-k insulating material 16 that are positioned above the second active region 10B.

Then, as shown in FIG. 1C, the patterned mask layer 20 and the remaining portions of the sacrificial protection layer 18 are removed. The patterned mask layer 20 may be removed by a variety of techniques, e.g., by performing a plasma ashing process. The remaining portions of the sacrificial protection layer 18 may be removed by performing a wet or dry etching process that selectively removes the sacrificial protection layer 18 relative to the underlying first layer of insulating material 16.

Next, as shown in FIG. 1D, various additional layers of material are formed above the substrate 10. As depicted, a second layer of high-k (k value of 10 or greater) insulating material 22, a metal layer 24 and a conductive layer 26, e.g., polysilicon or amorphous silicon, are deposited above the substrate 10. The second high-k gate insulation layer 22 may be comprised of a variety of high-k materials (k value greater than 10), such as hafnium oxide, hafnium silicate, lanthanum oxide, zirconium oxide, etc., and it may have a thickness similar to that of the first layer of high-k insulating material 16, e.g., it may have a thickness of about 2-3 nm. Thus, in one embodiment, the combined thickness of the first and second layers of high-k insulating material 16, 22 may be about 4-6 nm. Of course, the first and second layers of high-k insulating material 16, 22 need not be formed to the same thickness. The second layer of high-k insulating material 22 may be comprised of the same high-k insulating material that is used for the first layer of high-k insulating material 16, or the layers 16, 22 may be made of different high-k insulating materials. As depicted, above the first active region 10A where the first transistor device 100A will be formed, both the first and second layers of high-k insulating material 12, 22 are present, while only the second layer of high-k insulating material 22 is present above the second active region 10B, where the second transistor device 100B will be formed. The layer of metal 24 may be comprised of any of a variety of metal gate electrode materials which may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like, as well as a work function adjusting material, such as lanthanum or lanthanum oxide. The metal layer 24 may have a thickness of about 2-5 nm. The conductive layer 26 (e.g., polysilicon or amorphous silicon) may have a thickness of about 40-70 nm. The second layer of high-k insulating material 22, the metal layer 24 and the conductive layer 26 may be formed by performing a variety of known processes, e.g., a chemical vapor deposition (CVD) process, an atomic layer deposition (ALD) process, physical vapor deposition (PVD) process or plasma-enhanced versions of such processes.

Figure 1E:
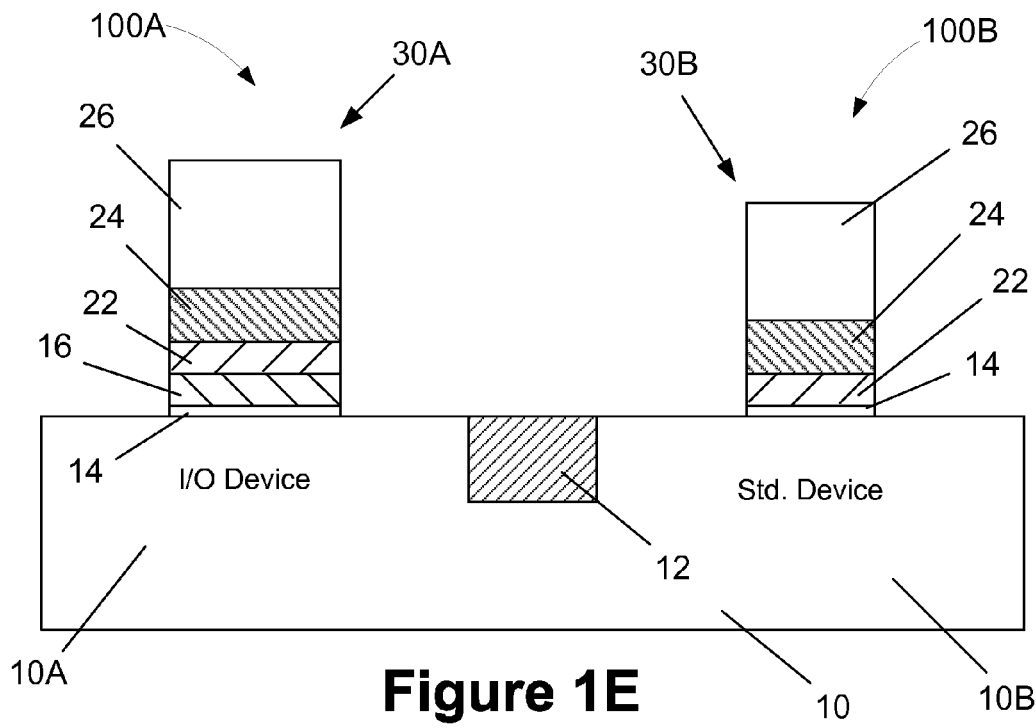

Next, as shown in FIG. 1E, using traditional photolithography and etching processes, illustrative first and second gate stacks 30A, 30B for the first transistor device 100A and the second transistor device 100B, respectively, are formed. More specifically, a patterned etch mask (not shown) such as a patterned photoresist mask, is formed above a gate cap layer (not shown) that is formed above the conductive layer 26, and one or more dry anisotropic etching processes are performed through the patterned etch mask on the various layers of material depicted in FIG. 1E to thereby define the depicted first and second gate stacks 30A, 30B.

Figure 1F:
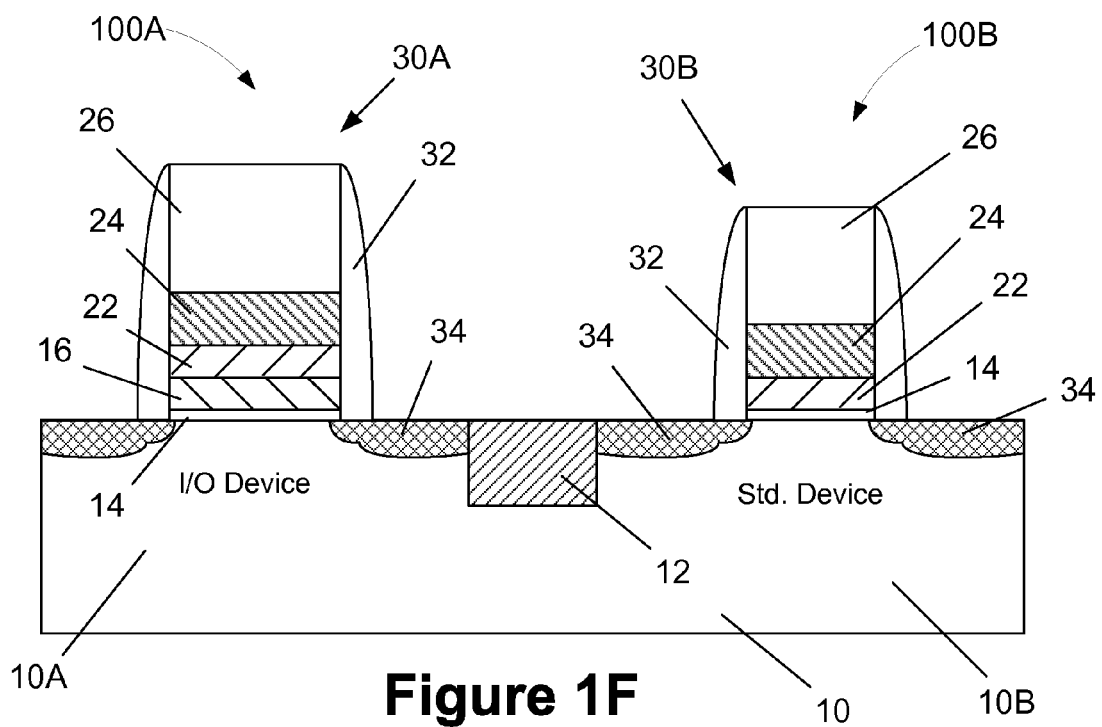

At this point in the process, traditional fabrication techniques may be performed to complete the fabrication of the first transistor device 100A and the second transistor device 100B. For example, FIG. 1F depicts the devices 100A, 100B after several process operations have been performed. Among other things, sidewall spacers 32 and source drain regions 34 have been formed for the devices 100A, 100B using traditional techniques. Of course, the sidewall spacers 32 and source/drain regions 34 need not be the same for each device, e.g., the dopant concentration in the source/drain regions 34 may be different for the two devices. As will be appreciated by those skilled in the art, all of the details of a completed transistor device are not depicted in the drawings. For example, such items as halo implant regions, metal silicide regions, gate cap layers and conductive contacts are not depicted so as not to obscure the present inventions.

As can be seen in FIG. 1F, the gate structure of the first transistor device 100A comprises both of the first and second layers of high-k insulating material 16, 22, the layer of metal 24 and the conductive layer 26, while the gate structure of the second transistor device 100B only contains the second layer of high-k insulating material 22, the layer of metal 24 and the conductive layer 26. Using the methods disclosed herein, the first transistor device 100A, i.e., the device that will be exposed to a relatively higher operating voltage, has a greater thickness of high-k insulating material (the combined thickness of the layers 16, 22), and that collection of high-k insulating material is not offset from the surface of the substrate, as was the case with prior art devices where there the gate insulation layer for these high voltage transistors was increased, as described in the background section of this application. As a result, using the methods and devices disclosed herein, both the relatively high voltage transistor devices 100A and the relatively low voltage transistor devices 100B may exhibit the performance increases associated with the use of gate stacks having a high-k/metal layer(s) configuration.

FIGS. 2A-2H depict an illustrative example wherein the methods disclosed herein may be employed when the various transistor devices are formed using so-called "replacement gate" (RMG) or "gate-last" techniques. In general, the replacement gate technique involves forming a transistor device with a sacrificial gate structure, including the formation of source/drain regions, metal silicide contact regions, etc., and thereafter removing the sacrificial gate structure and replacing it with a final gate structure that typically includes at least one layer of metal.

FIG. 2A depicts another embodiment of the device that is formed above the semiconducting substrate 10. As before, the device is generally comprised of a first transistor device 100A and a second transistor device 100B. The first transistor device 100A will be formed in and above the first active region 10A, while the second transistor device 100B will be formed in and above the second active region 10B. As the point of processing depicted in FIG. 2A, the basic transistor structures have been formed. More specifically, at the point of fabrication depicted in FIG. 2A, the sacrificial gate structures that are formed as part of the process of forming the devices 100A, 100B have been formed. Each of the sacrificial structures typically includes a sacrificial or dummy gate insulation layer 40A, a dummy or sacrificial gate electrode 40B and a protective gate cap layer 42. However, in some applications, the dummy gate insulation layer 40A may be incorporated into the final device. Also depicted are a liner layer 46, sidewall spacers 48 and a plurality of source/drain regions 50 that have been formed in the substrate 10 that will typically be part of the completed devices 100A, 100B. The various components and structures of the device 100 may be formed using a variety of different materials and by performing a variety of known techniques. For example, the sacrificial gate insulation layer 40A may be comprised of silicon dioxide, the sacrificial gate electrode 40B may be comprised of polysilicon and the sidewall spacers 48 may be comprised of silicon nitride. The source/drain regions 50 may be comprised of implanted dopant materials (N-type dopants for NFET devices and P-type dopants for PFET devices) that are implanted into the substrate 10 using known masking and ion implantation techniques. Of course, those skilled in the art will recognize that there are other features of the transistors that are not depicted in the drawings for purposes of clarity. For example, so-called halo implant regions are not depicted in the drawings, as well as various layers or regions of silicon/germanium that may be employed in high-performance PFET transistors.

Next, as shown in FIG. 2B, a layer of insulating material 52, such as silicon dioxide, is deposited above the substrate 10. FIG. 2C depicts the device after one or more chemical mechanical polishing (CMP) processes have been performed to remove any materials above the sacrificial gate electrode 40B, such as the protective cap layer 42, so that at least the sacrificial gate electrode 40B may be removed. With reference to FIG. 2D, one or more etching processes are performed to remove the sacrificial gate electrode 40B without damaging the sidewall spacers 48 and the insulating material 52 to thereby define first and second gate cavities 54A, 54B for where the replacement gates will be formed for the first transistor device 100A and the second transistor device 100B, respectively. In the depicted embodiment, the dummy gate insulation layer 40A remains within the cavities 54A, 54B. Alternatively, the dummy gate insulation layer 40A may be removed after the sacrificial gate electrode 40B is removed. In such a case, a relatively thin oxide layer would need to be formed on the substrate within the gate cavities prior to the deposition of a high-k insulating material.

Next, as shown in FIG. 2E, the first layer of high-k insulating material 16 and the protection layer 18 are each formed above the substrate 10 and in the first and second gate cavities 54A, 54B by performing a conformal deposition process. With reference to FIG. 2F, a patterned etch mask 56, e.g., a patterned layer of photoresist material, is formed above the first active region 10A of the substrate 10 using well-known photolithography tools and techniques. The patterned etch mask 56 covers the first transistor device 100A in the first active region 10A and leaves the second transistor device 100B in the second active region 10B exposed for further processing. Next, as shown in FIG. 2F, one or more dry anisotropic etching processes are performed through the patterned etch mask 56 to remove at least the sacrificial protection layer 18 and the first layer of high-k insulating material 16 from above the second active region 10B.

Then, as shown in FIG. 2G, the patterned mask layer 56 and the remaining portions of the sacrificial protection layer 18 are removed. The patterned mask layer 56 may be removed by performing a plasma ashing process. The remaining portions of the sacrificial protection layer 18 may be removed by performing a wet or dry etching process that selectively removes the protection layer 18 relative to the underlying first layer of insulating material 16. The second layer of high-k insulating material 22 is then conformably deposited across the device 100 the first layer of insulating material 16 and in the first and second gate cavities 54A, 54B. As depicted, above the first active region 10A where the first transistor device 100A will be formed, both the first and second layers of high-k insulating material 16, 22 are present, while only the second layer of high-k insulating material 22 is present above the second active region 10B, where the second transistor device 100B will be formed. FIG. 2H depicts the device after various metal regions 60A, 60B for the gate structures of the first transistor device 100A and the second transistor device 100B, respectively, have been formed. In general, the structure depicted in FIG. 2H may be formed by depositing one or more metal layers above the second layer of high-k insulating material 22 and in the first and second gate cavities 54A, 54B and thereafter performing one or more CMP process to remove the excess materials positioned outside of the gate cavities 54A, 54B. The metal regions 60A, 60B may be comprised of any metal, including those described above with respect to the layer of metal 24. The metals used in the replacement gate structures for the first transistor device 100A and the second transistor device 100B may be different in terms of numbers of metal layers as well as the metal materials themselves.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first layer of high-k insulating material above a first active region and a second active region defined in a semiconducting substrate;
   forming a sacrificial protection layer above said first layer of high-k insulating material;
   forming a patterned etch mask to cover said sacrificial protection layer above said first active region and expose said sacrificial protection layer above said second active region;
   performing one or more etching processes through said patterned etch mask to remove said first layer of high-k insulating material and said sacrificial protection layer from above said second active region while leaving said first layer of high-k insulating material and said sacrificial protection layer above said first active region;
   removing said sacrificial protection layer from above said first layer of high-k insulating material that is positioned above said first active region;
   forming a second layer of high-k insulating material above said first layer of high-k insulating material positioned above said first active region and above said second active region;
   forming at least one layer of metal above said second layer of high-k insulating material; and
   removing portions of said first and second layers of high-k insulating material and said at least one metal layer to thereby form a first gate stack positioned above said first active region and to form a second gate stack positioned above said second active region, wherein said first gate stack is comprised of at least said first and second layers of high-k insulating material and said at least one layer of metal and wherein said second gate stack is comprised of at least said second layer of high-k insulating material and said at least one layer of metal.

2. The method of claim 1, wherein said first layer of high-k insulating material and said second layer of high-k insulating material are comprised of the same high-k insulating material.

3. The method of claim 1, wherein said first layer of high-k insulating material and said second layer of high-k insulating material are comprised of different high-k insulating materials.

4. The method of claim 1, wherein said first layer of high-k insulating material and said second layer of high-k insulating material are formed to the same thickness.

5. The method of claim 1, wherein said first layer of high-k insulating material and said second layer of high-k insulating material are formed to different thicknesses.

6. The method of claim 1, wherein said first gate stack has a gate length that is greater than a gate length of said second gate stack.

7. The method of claim 1, wherein removing said portions of said first and second layers of high-k insulating material and said at least one metal layer to thereby form said first gate stack positioned above said first active region and to form said second gate stack positioned above said second active region comprises performing at least one etching process through a patterned etch mask to remove said portions of said first and second layers of high-k insulating material and said at least one metal layer to thereby form said first and second gate stacks.

8. The method of claim 1, wherein removing said portions of said first and second layers of high-k insulating material and said at least one metal layer to thereby form said first gate stack positioned above said first active region and to form said second gate stack positioned above said second active region comprises performing at least one chemical mechanical polishing process to remove said portions of said first and second layers of high-k insulating material and said at least one metal layer to thereby form said first and second gate stacks.

9. The method of claim 1, wherein said patterned etch mask layer is a layer of patterned photoresist material.

10. A method, comprising:
    forming a first layer of high-k insulating material above a first active region and a second active region defined in a semiconducting substrate;
    forming a sacrificial protection layer above said first layer of high-k insulating material;
    forming a patterned etch mask to cover said sacrificial protection layer above said first active region and expose said sacrificial protection layer above said second active region;
    performing one or more etching processes through said patterned etch mask to remove said first layer of high-k insulating material and said sacrificial protection layer from above said second active region while leaving said first layer of high-k insulating material and said sacrificial protection layer above said first active region;
    removing said sacrificial protection layer from above said first layer of high-k insulating material that is positioned above said first active region;
    forming a second layer of high-k insulating material above said first layer of high-k insulating material positioned above said first active region and above said second active region;
    forming at least one layer of metal above said second layer of high-k insulating material;
    forming a conductive layer comprised of polysilicon or amorphous silicon above said at least one layer of metal;
    forming a patterned etch mask above said conductive layer; and
    performing at least one etching process through said patterned etch mask to remove portions of said first and second layers of high-k insulating material, said at least one metal layer and said conductive layer to thereby form a first gate stack positioned above said first active region and to form a second gate stack positioned above said second active region, wherein said first gate stack is comprised of at least said first and second layers of high-k insulating material, said at least one layer of metal and said conductive layer and wherein said second gate stack is comprised of at least said second layer of high-k insulating material, said at least one layer of metal and said conductive layer.

11. The method of claim 10, wherein said first layer of high-k insulating material and said second layer of high-k insulating material are formed to the same thickness.

12. The method of claim 10, wherein said first layer of high-k insulating material and said second layer of high-k insulating material are formed to different thicknesses.

13. The method of claim 10, wherein said first gate stack has a gate length that is greater than a gate length of said second gate stack.

14. The method of claim 10, wherein said patterned etch mask layer is a layer of patterned photoresist material.

15. A method, comprising:
forming a first sacrificial gate structure and a second sacrificial gate structure above first and second active regions, respectively, of a semiconducting substrate;
removing said first and second sacrificial gate structures to thereby define first and second replacement gate cavities above said first and second active regions, respectively;
forming a first layer of high-k insulating material above said first and second active regions and in said first and second replacement gate cavities;
forming a sacrificial protection layer above said first and second active regions and in said first and second replacement gate cavities above said first layer of high-k insulating material;
forming a patterned etch mask above said sacrificial protection layer, said patterned etch mask being positioned above said first active region;
performing at least one first etching process to remove said first layer of high-k insulating material and said sacrificial protection layer from above said second active region and from within said second gate cavity while leaving said first layer of high-k insulating material and said sacrificial protection layer above said first active region and in said first gate cavity;
removing said sacrificial protection layer from above said first layer of high-k insulating material that is positioned above said first active region and in said first gate cavity;
forming a second layer of high-k insulating material above said first layer of high-k insulating material positioned above said first active region and in said first gate cavity and above said second active region and in said second gate cavity;
forming at least one layer of metal above said second layer of high-k insulating material and in said first and second gate cavities; and
performing at least one chemical mechanical polishing process to remove portions of said first and second layers of high-k insulating material and said at least one metal layer positioned outside of said first and second gate cavities to thereby form a first replacement gate stack positioned above said first active region and to form a second replacement gate stack positioned above said second active region, wherein said first replacement gate stack is comprised of at least said first and second layers of high-k insulating material and said at least one layer of metal and wherein said second replacement gate stack is comprised of at least said second layer of high-k insulating material and said at least one layer of metal.

16. The method of claim 15, wherein said first layer of high-k insulating material and said second layer of high-k insulating material are formed to the same thickness.

17. The method of claim 15, wherein said first layer of high-k insulating material and said second layer of high-k insulating material are formed to different thicknesses.

18. The method of claim 15, wherein said first gate stack has a gate length that is greater than a gate length of said second gate stack.

19. A method, comprising:
forming a first layer of high-k insulating material above a first active region and a second active region defined in a semiconducting substrate;
forming a sacrificial protection layer above said first layer of high-k insulating material;
removing said first layer of high-k insulating material and said sacrificial protection layer from above said second active region while leaving said first layer of high-k insulating material and said sacrificial protection layer above said first active region;
removing said sacrificial protection layer from above said first layer of high-k insulating material that is positioned above said first active region;
forming a second layer of high-k insulating material above said first layer of high-k insulating material positioned above said first active region and above said second active region;
forming at least one layer of metal above said second layer of high-k insulating material; and
removing portions of said first and second layers of high-k insulating material and said at least one metal layer to thereby form a first gate stack having a first gate length positioned above said first active region and to form a second gate stack having a second gate length that is less than said first gate length positioned above said second active region, wherein said first gate stack is comprised of at least said first and second layers of high-k insulating material and said at least one layer of metal and wherein said second gate stack is comprised of at least said second layer of high-k insulating material and said at least one layer of metal.

* * * * *